(12) United States Patent
Allred

(10) Patent No.: US 6,917,223 B2
(45) Date of Patent: Jul. 12, 2005

(54) GAUSSIAN NOISE GENERATOR

(75) Inventor: Rustin W. Allred, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 10/420,314

(22) Filed: Apr. 22, 2003

(65) Prior Publication Data

US 2004/0212424 A1 Oct. 28, 2004

(51) Int. Cl.$^7$ .............................................. H03K 17/00
(52) U.S. Cl. ........................ 327/100; 327/107; 327/164
(58) Field of Search ................................ 327/100, 105, 327/107, 164; 375/350; 331/78

(56) References Cited

U.S. PATENT DOCUMENTS 4,375,620 A * 3/1983 Singer et al. .................. 331/78
5,774,505 A * 6/1998 Baugh ......................... 375/348
5,920,241 A * 7/1999 Mazzochette ............... 333/174

OTHER PUBLICATIONS

Papoulis, A.; "Probability, Random Variables, and Stochastic Processes," McGraw–Hill, 1984, pp. 194–195.

* cited by examiner

*Primary Examiner*—Kenneth B. Wells
(74) *Attorney, Agent, or Firm*—W. Daniel Swayze, Jr.; W. James Brady; Frederick J. Telecky, Jr.

(57) ABSTRACT

A signal generator (10). The signal generator comprises circuitry (20) for producing at least a first input noise signal ($N_1$), wherein the first input noise signal has a statistically insignificant autocorrelation. The signal generator also comprises an allpass filter circuit (40) coupled to receive and filter the first input noise signal and for outputting in response a white noise signal (50) having a Gaussian probability distribution function

29 Claims, 4 Drawing Sheets

Figure 1:
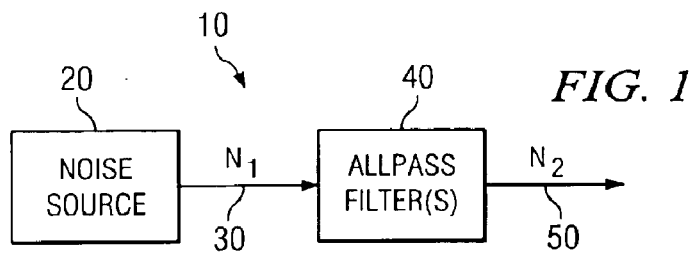

GAUSSIAN NOISE GENERATOR

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic signal processing circuits and are more particularly directed to a circuit for generating a noise signal having a Guassian probability distribution function ("PDF"), for use in implementations where such a noise signal is desired or useful, such as in circuit testing applications.

Electronic circuits have become prevalent in numerous applications, including uses for devices in personal, business, and other environments. Demands of the marketplace affect many aspects of circuit design, including factors such as device complexity and cost. Various electronic circuits are directed to signal processing and, quite often, these circuits also are subject to these design factors. Often in testing components such as audio components, whether in design testing or through auto-testing, one or more source signals are generated with known characteristics, where one of these signals is then applied to a device so that the response to the signal may be evaluated, thereby providing data to characterize the device. In audio processing, one type of favorable source signal is a white noise signal having a Gaussian PDF. Such signals are often preferred for various reasons. For example, such a signal has a relatively flat signal spectrum density. As another example, such a signal has a very low autocorrelation at non-zero lag. As still another example, a linear operation applied to such an input signal produces an output signal that also has a Gaussian PDF. Each of these attributes often simplifies or renders more usable the testability of a device subject to a signal with these attributes.

The prior art has described circuits for providing a signal, such as to be used for a test signal, and having a Gaussian PDF. For example, one such circuit implements a random number generator, where the initially generated output alone may provide a relatively flat PDF. However, the initially generated output is then sampled by an algorithm that provides a modified output, where the modified output includes some values that are the same as sampled from the initially generated output, while other values in the modified output are substituted in place of corresponding samples in the initially generated output. More specifically, the algorithm samples the initially generated output and in some instances passes the sample out as part of the ultimate output where, in other instances and provided the sample is within a certain range, the algorithm substitutes a differing value in place of the sample and outputs this differing value. Accordingly, the series of ultimate outputs signals comprise both passed input samples as well as some substituted values, thereby forming a collection of samples having a Gaussian PDF.

While the above-described algorithm for producing a signal with a Gaussian PDF has proven workable in various implementations, the present inventor has determined that in certain situations an alternative may be favorable. For example, in some audio processing contexts, an audio processing circuit may include various circuitry that exists for certain signal processing purposes; such circuitry may include signal sources, such as for use in audio dithering, and also signal filters. The present inventor has further recognized that these devices may be further configured and programmed in order to provide a resulting output white noise signal having a Gaussian PDF without the need for circuitry, software, and/or firmware to implement the above-described algorithm. Thus, device complexity and cost may be reduced as compared to a design requiring additional architecture to implement the prior art approach. In addition, one skilled in the art will appreciate other instances in which the preferred embodiments may more favorably provide an output white noise signal having a Gaussian PDF over those used in the prior art.

BRIEF SUMMARY OF THE INVENTION

In the preferred embodiment, there is a signal generator. The signal generator comprises circuitry for producing at least a first input noise signal, wherein the first input noise signal has a statistically insignificant autocorrelation. The signal generator also comprises an allpass filter circuit coupled to receive and filter the first input noise signal and for outputting in response a white noise signal having a Gaussian probability distribution function.

Other aspects are also disclosed and claimed.

BRIEF DESCRIPTION OF THE SEVERAL VIEWS OF THE DRAWING

FIG. 1 illustrates a block diagram of a noise generator according to a preferred embodiment.

FIG. 2 illustrates a plot of samples of a signal $N_1$ produced by a triangularly distributed noise source, which is one preferred embodiment for noise source block 20 in FIG. 1.

FIG. 3 illustrates a histogram of the signal $N_1$ in FIG. 2 over a much larger number of the samples.

FIG. 4 illustrates a plot of the autocorrelation of the noise source signal $N_1$ from FIGS. 2 and 3.

FIG. 5 illustrates a spectral density plot of the noise source signal $N_1$ from FIGS. 2 and 3.

FIG. 6 illustrates the infinite impulse response of a $15^{th}$ order allpass filter according to a preferred embodiment.

FIG. 7 illustrates the infinite impulse response of a $30^{th}$ order allpass filter according to a preferred embodiment.

FIG. 8 illustrates samples of an output noise signal $N_2$ having a Gaussian PDF according to the preferred embodiment.

FIG. 9 illustrates a histogram of the output noise signal $N_2$ of FIG. 8.

FIG. 10 illustrates a plot of the autocorrelation of the output noise signal $N_2$ of FIG. 8.

FIG. 11 illustrates a spectral density plot of the output noise signal $N_2$ of FIG. 8.

FIG. 12 illustrates an example of an implementation of a preferred embodiment in connection with an integrated circuit.

DETAILED DESCRIPTION OF THE INVENTION

FIG. 1 illustrates a block diagram of a noise generator designated generally at 10. In one preferred embodiment, noise generator 10 may be constructed using a single integrated circuit or, as an alternative in another preferred embodiment, more than one device may be combined to form generator 10. Indeed, as detailed later, noise generator 10 also may be constructed by programming and providing connections with respect to a commercially available audio integrated circuit device. Turning then to the illustrated aspects of FIG. 1, generator 10 includes a noise source block 20, which is a circuit that operates to provide at an output 30 a noise signal, $N_1$. Noise signal $N_1$ is connected as an input to an allpass filter(s) block 40, and the one or more filters in block 40 thereby filter the noise signal $N_1$ to produce at an output 50 a resulting output noise signal, $N_2$. More specifically and as detailed below, this operation transforms the input noise signal $N_1$, which does not have a Gaussian probability distribution function ("PDF") into the noise signal $N_2$, which does have a Gaussian PDF. This operation will be further evident from the remaining discussion, which further details the circuitry and functionality of blocks 20 and 40.

Looking to noise source block 20 in greater detail, in the preferred embodiment it is such that the noise signal $N_1$ it produces has two characteristics. First, preferably noise signal $N_1$ has a low auto-correlation (sometimes referred to as "uncorrelated"), that is, it lacks a statistically significant correlation with itself at non-zero lag positions. Second, preferably noise signal $N_1$ has a relatively flat magnitude across its power spectral density. The reasons for desiring these attributes are further explored later. At this point however, and by way of example, in one preferred embodiment, noise source block 20 provides noise signal $N_1$ as a triangularly distributed noise source, which thereby meets the two above-desired characteristics, as is further described below.

Figure 2:
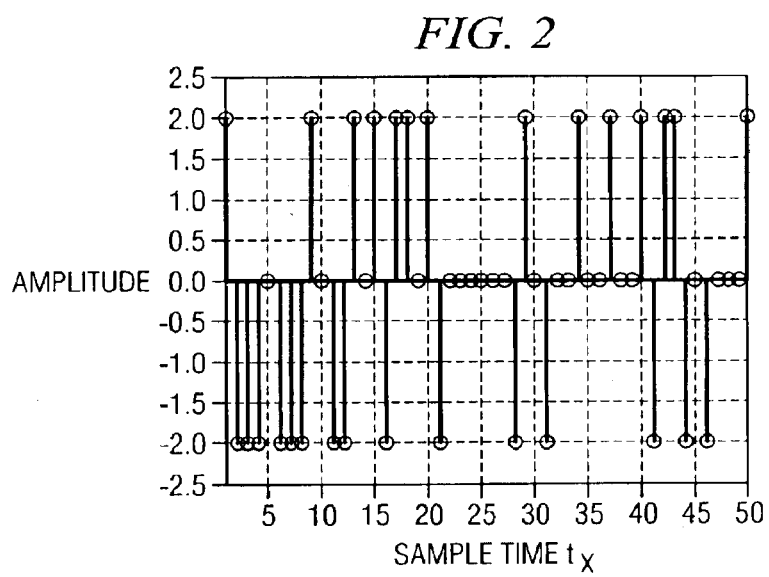
Figure 3:
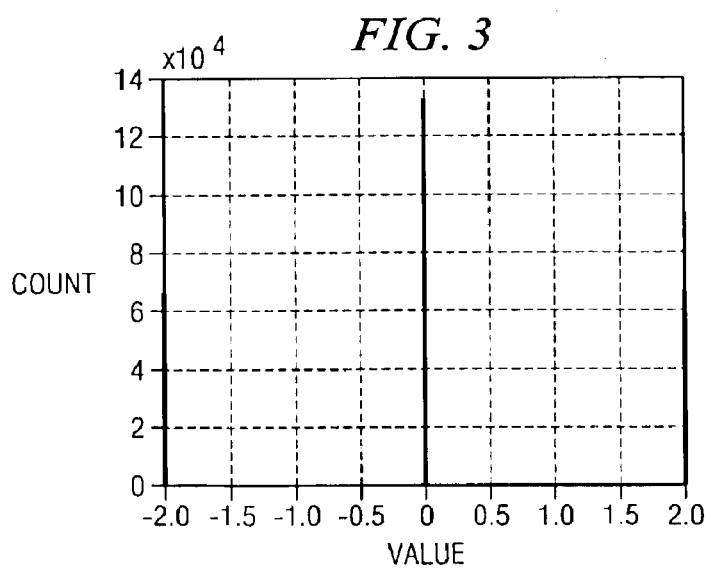

FIG. 2 illustrates a plot of samples of noise signal $N_1$ as produced by a triangularly distributed noise source, which as mentioned above is one preferred embodiment for noise source block 20. In FIG. 2, the horizontal axis indicates sample time and the vertical axis indicates a digital value corresponding to the sample amplitude. Thus, in the example of FIG. 2, triangularly-distributed noise source is provided, and as such its output states may be represented by only two bits. Specifically, in the illustrated example, the output states are seen to be either –2, 0, or +2, that is, only one of three states, thereby being able to be represented by only two bits. Further, over a large enough amount of sample times, by definition a triangularly distributed noise source provides its middle output value, which is a value of 0 in the present case, during one-half of those sample times, while it further produces each of its two extreme output values, which are values of –2 and +2 in the present case, during one-fourth of those sample times. To further demonstrate these aspects, FIG. 3 illustrates a histogram of the signal $N_1$ in FIG. 2 over a much larger number of the sample times. In FIG. 3, the horizontal axis indicates the sample value, and the vertical axis indicates the number of total times a sample value has been counted. Thus, it may be seen that each of the values of –2 and +2 have been produced on the order of $6.5(10)^{14}$ times, while the value of 0 has been produced on the order of $13(10)^{14}$ times, that is, twice as often as either of the values of –2 and +2. Thus, a triangle would be formed if the peaks of each of the values in the histogram were connected, thereby giving rise to the descriptor of a "triangularly distributed noise source."

Recall also that the noise signal $N_1$, as produced by source block 20, preferably has two attributes, namely, a statistically insignificant autocorrelation and a relatively flat spectral density. In connection with the triangularly distributed noise source, these attributes are indeed present as is now explored in connection with FIGS. 4 and 5, each of which is detailed below.

Figure 4:
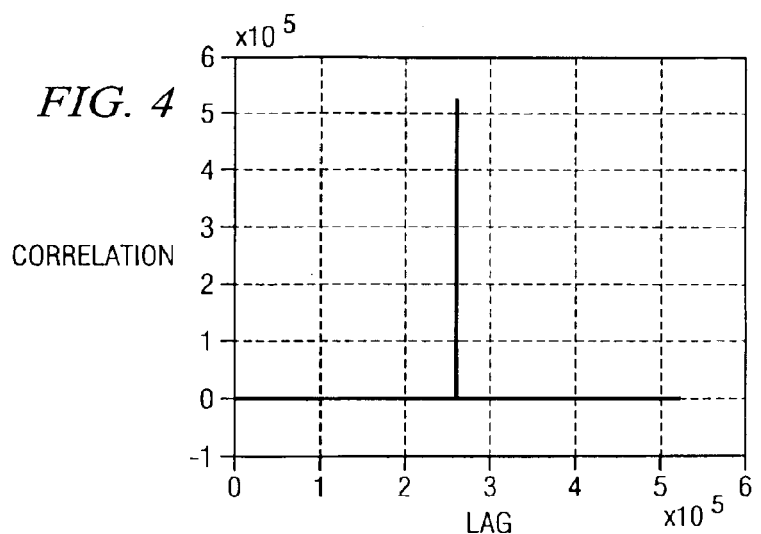

FIG. 4 illustrates a plot of the autocorrelation of the noise source from FIGS. 2 and 3, where the vertical axis in FIG. 4 indicates the correlation measure, and the horizontal axis in FIG. 4 designates the overlay of sampling space (or "time lag") of the noise signal in different time positions relative to it in a fixed time position, as is the common form of comparison for purposes of evaluating autocorrelation. As readily appreciated by one skilled in the art, the correlation is large only at a single point, which corresponds to the instance when the noise signal is compared directly to itself, that is, when the two signals being compared are at identical time positions (i.e., at zero time lag). Away from that peak correlation, however, it is seen that the correlation drops to a statistically insignificant near-zero value. By way of introduction to principles further detailed below, lastly note that the low autocorrelation of the noise signal $N_1$ is desirable in that it gives rise to a better distribution in the sense of the goal of a Guassian PDF in the ultimate output noise signal $N_2$, after the operation of allpass filter(s) block 40.

Figure 5:
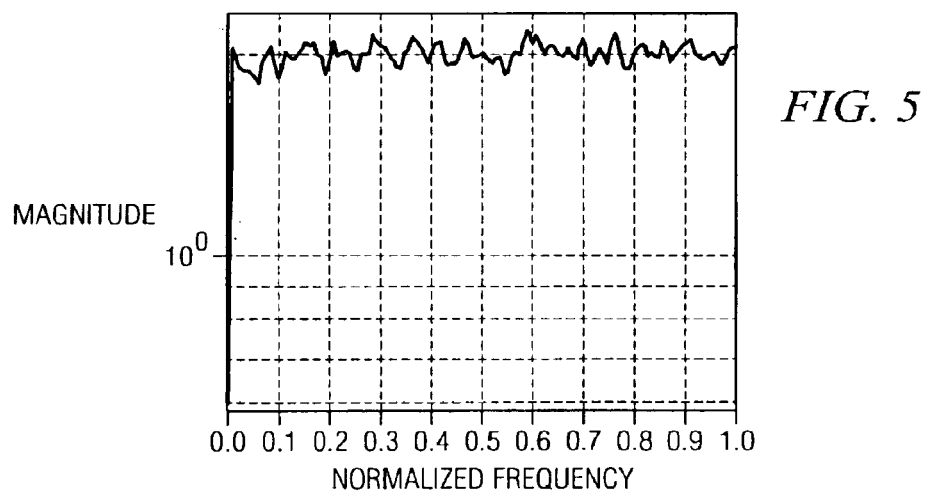

FIG. 5 illustrates a spectral density plot of noise signal $N_1$ from FIGS. 2 and 3, where the vertical axis in FIG. 5 indicates magnitude and the horizontal axis indicates a normalized frequency over a range of interest, such as in the audible range of frequencies. In FIG. 5, it may be seen that the spectral density of the noise signal is relatively flat or white, that is, in an approximate sense, it can be seen that the magnitude varies not more than a few dB and it varies randomly as opposed to with some pattern or repeated slope. Thus, the spectral density to a first approximation is nearly flat by considering the fluctuations in this range as negligible and random around an approximate value of 6. Lastly, note that the approximately flat spectral density provided in FIG. 5 is believed to be beneficial in that the noise signal $N_1$ thereby provides an input that can provide a corresponding ultimate output signal $N_2$ that receives an approximately uniform magnitude of excitation signals across all frequencies within the desired frequency band.

Returning to FIG. 1 and looking to allpass filter(s) block 40 in greater detail, first note that it is referred to as having "filter(s)" in that in the preferred embodiment one or more filters may be used, such as by cascading lower order filters to achieve an overall higher ordered filter, and where the cascading also can be done by duplicating a filter such that a signal is filtered twice, once through a first filter and then a second time through the duplicate filter. As shown later, such alternatives are readily favorable in instances where pre-existing electronics are configurable or programmable to achieve alternative filter characteristics. Next, the choice of an allpass filter (or more than one such filter) is preferred for at least the following two reasons. First, an allpass filter does not affect the magnitude spectrum of the input signal being filtered; further, recall in the preferred embodiment that this input signal is noise signal, $N_1$, which recall further as shown in FIG. 5 has a relatively flat spectral density. Accordingly, since noise signal $N_1$ has a relatively flat spectral density and since block 40 implements an allpass filter, then the resulting output noise signal $N_2$ also will have a relatively flat spectral density, as is the case for the desired Guassian distribution output. Second, an allpass filter may be created with an impulse response that will effectively add variously time-shifted and scaled copies of the input signal. The benefit of this aspect, as recognized by the present inventor, is appreciated by first reviewing the "Central Limit Theorem." The Theorem is known in the art and is described, by way of example, in Papoulis, A., *Probability, Random Variables, and Stochastic Processes,* McGraw-Hill, 1984, pp. 194–195, which is hereby incorporated herein by reference. Particularly, that Theorem states that as various independent noise sources of any distributions are added together, the distribution of the resulting noise will tend toward a Gaussian or Normal distribution. The present inventor, however, has recognized that as an alternative to adding various different noise sources in this regard, the combination of noise source block 20 and allpass filter block 40 achieve a comparable result to the Theorem's approach. More particularly, the operation of filtering with an allpass filter may be considered to achieve a convolution of the filter input signal with the infinite impulse response ("IIR") of the filter. Further, applying this concept in the context of noise generator 10, this convolution effectively determines a sum for numerous comparisons of incrementally time-shifted representations of the input signal with the time-reversed IIR of the filter. More specifically, for a single time representation of these two signals overlapping at least in part in time, each sample of the input signal is multiplied times a time-aligned corresponding sample in the time-reversed IIR of the filter to form a product, and then all of the products are summed to provide a total sum for the corresponding time representation. This process is repeated for each other incrementally time-shifted representation of the input signal with the time-reversed IIR of the filter, where those representations overlap in time, thereby providing a respective sum for each of those other incrementally time-shifted representations. The present inventor has therefore recognized that, when examined in this manner, the operation of the allpass filter on a single input signal having a low (i.e., statistically independent) autocorrelation provides effectively a sum on what will appear to be various independent noise sources because each incrementally time-shifted representation of the input signal has no (significant) correlation to a different one of the incrementally time-shifted representations of the input signal. As a result, the output of the allpass filter approaches that of the result of the Theorem, that is, it will tend toward a Gaussian or Normal distribution. Given the preceding, therefore, one skilled in the art may now appreciate the preferred choice of an all allpass filter in combination with noise source block 20, as explored still further below.

Having demonstrated the preferred choice of an allpass filter, attention is now directed to a particular preferred implementation of such a filter. As a first consideration, since, as explained above, the filter's operation may be viewed in the sense of a convolution involving its IIR, then using a second order filter would necessarily cause the resulting output to include components relating to two time-shifted representations of the input signal that are separated in time by only one sample time. In other words, the first order effect applies to a first time-shifted representation of the input signal while the second order effect applies to a second, and immediately-adjacent, time-shifted representation of the input signal. Even though such immediately-adjacent time-shifted representations may be statistically uncorrelated as suggested by the uniformly low correlation illustrated by FIG. 4, an additional level of margin may be established by choosing an allpass filter having an order greater than two, although a second order filter still would operate according to the preferred embodiment. A second consideration relating to a preferred implementation of an allpass filter is the selection of the filter coefficients. Preferably, such coefficients are selected so that the IIR of the filter has a variability in the amplitudes across the IIR. In this regard, as one approach, these coefficients can be selected such that there are relatively few, high-value amplitudes before the IIR considerably decays, or as another approach these coefficients can be selected such that there can be a relatively long impulse response of low-value amplitudes. In the preferred embodiment, an IIR is chosen that compromises between these approaches, that is, that includes a mix of larger and smaller amplitudes, with the IIR lasting for an intermediately long duration as compared to the two approaches suggested immediately above.

An example of applying the above-described considerations is now explored. Specifically, Texas Instruments Incorporated, the assignee of the subject patent, presently commercially sells a part identified as the TAS3103. The TAS3103 is a single integrated circuit that includes, among other things, 60 second order IIR filters, and these filters are programmable in that filter coefficients may be supplied to the integrated circuit to effect a resulting filter transfer function, and note also that two or more of the filters may be cascaded to achieve higher-order filters. Given the availability of these programmable filters, in one preferred embodiment eight of the filters may be cascaded to form a fifteenth (of sixteen) order allpass filter, having a transfer function as shown in the following Equation 1:

$$H(z) = \frac{0.5 - 0.5z^{-5} - 0.5z^{-10} + z^{-15}}{1 - 0.5z^{-5} - 0.5z^{-10} + 0.5z^{-15}} \qquad \text{Equation 1}$$

More generally, Equation 1 may be represented in the form of the following Equation 2:

$$H(z) = \frac{b_0 + b_1 z^{-1} + b_2 z^{-2} + b_3 z^{-3} + \ldots + b_{n-1} z^{-(n-1)} + b_n z^{-n}}{1 + a_1 z^{-1} + a_2 z^{-2} + a_3 z^{-3} + \ldots + a_{n-1} z^{-(n-1)} + a_n z^{-n}} \qquad \text{Equation 2}$$

Figure 6:
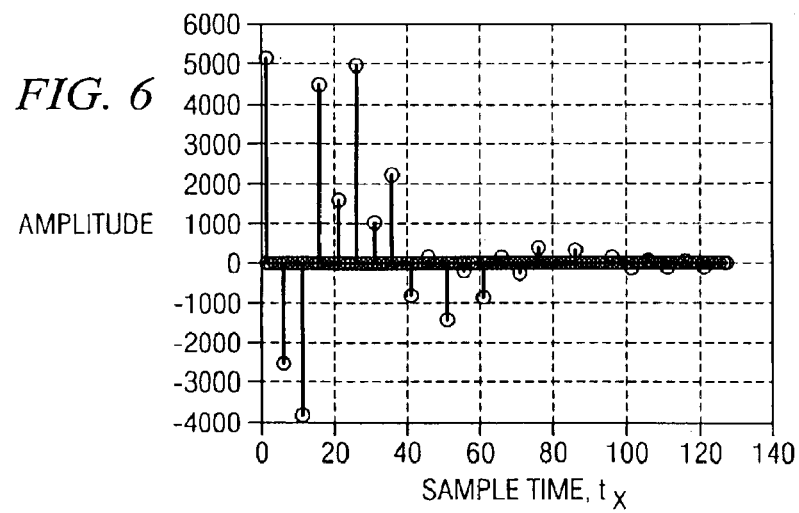

Note with respect to Equations 1 and 2, for a filter to serve as an allpass filter, then the denominator coefficients $\{a_1, a_2, \ldots, a_n\}$ are the reverse of the numerator coefficients, that is, $\{b_n=1, b_{n-1}=a_1, b_{n-2}=a_2, \ldots, b_1=a_{n-1}, b_0=a_n\}$ Note also with respect to Equatin 1 and also to serve as an allpass filter, like powers of $z^{-x}$ are populated in both the numerator and denominator, where in Equation 1 these powers are $-5$, $-10$, and $-15$. As such, Equation 1 gives rise to an allpass filter characteristic. Note further in Equation 1 that there are four powers of $z^{-x}$ missing between each term; this gives rise to an IIR that affects only non-zero samples every fifth term. As a result, when the filter is applied, it affects only samples in the input signal that are five sample spaces apart. In addition, the coefficient values of 0.5 give rise to the desired IIR with a medium-duration and various magnitude values ranging from large to small. The IIR of this filter, with scaling applied (the original signal is very small, but a full-scale output signal is desired), is shown in FIG. 6. Particularly, in FIG. 6, the horizontal axis indicates sample time and the vertical axis indicates amplitude. Further, FIG. 6 illustrates that the preferred attributes and observations set forth above are achieved by the allpass filter having the transfer function of Equation 1. For example, FIG. 6 demonstrates that the absolute values of the response amplitudes as well as the sign of the amplitudes vary over time. For example, at time $t_1$ an amplitude on the order of 5,100 is shown and at time $t_{16}$ an amplitude on the order of 4,500 is shown. However, between those two times, two non-zero negative amplitudes are shown, namely, a value on the order of $-2,500$ at time $t_6$ and a value on the order of $-3,800$ at time $t_{11}$. Thus, the absolute value of these four amplitudes is such that the amplitude of the response first decreases from $t_1$ to $t_6$, then increases from $t_6$ to $t_{11}$, then increases from $t_{11}$ to $t_{16}$, and so forth. Further, as indicated above, only every fifth sample has a non-zero amplitude, as shown by way of example by the zero values at times $t_2$, $t_3$, $t_4$, $t_5$, and $t_7$, $t_8$, $t_9$, $t_{10}$, and so forth.

Figure 7:
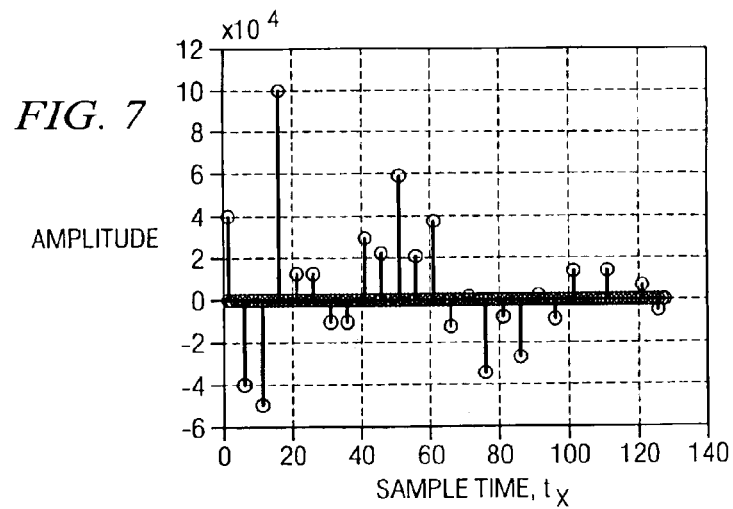

Further in connection with the allpass filter established above and having the transfer function of Equation 1, because the TAS3103 includes a total of 60 programmable second order filters, then a first set of eight filters can be programmed to provide the Equation 1 $15^{th}$ order filter, and a second set of eight filters also can be programmed to provide the Equation 1 filter, while further configuring the output of the first set as an input to the second set. As a result, a $30^{th}$ order filter is created, and it has the IIR shown in FIG. 7. In FIG. 7, in the same manner as FIG. 6, the horizontal axis indicates sample time and the vertical axis indicates amplitude, although the amplitudes are scaled larger in FIG. 7. As can be seen in FIG. 7, the filter provides again the same desired attributes of those described in connection with FIG. 6, while further providing relatively larger amplitudes over a longer period of time. For example, in FIG. 6, following the sample at $t_{61}$, the amplitudes of each of the remaining illustrated amplitudes are relatively small. In contrast, however, in FIG. 7, following the sample at $t_{61}$, there are additional amplitudes having relatively large values.

Figure 8:
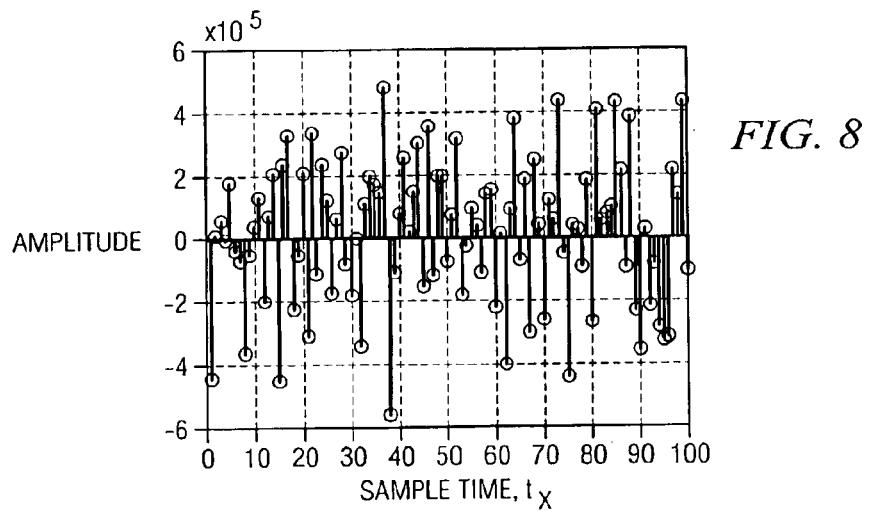
Figure 9:
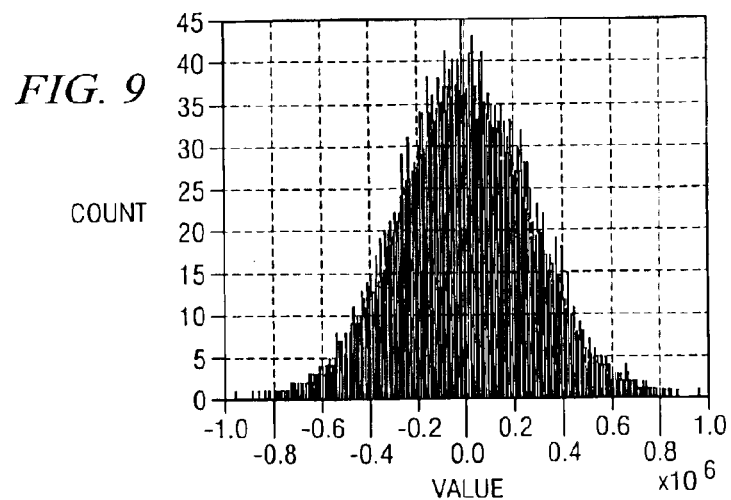
Figure 10:
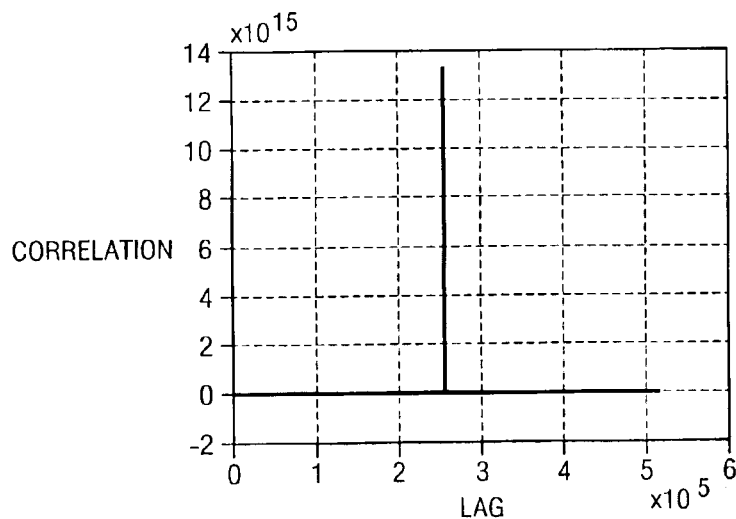
Figure 11:
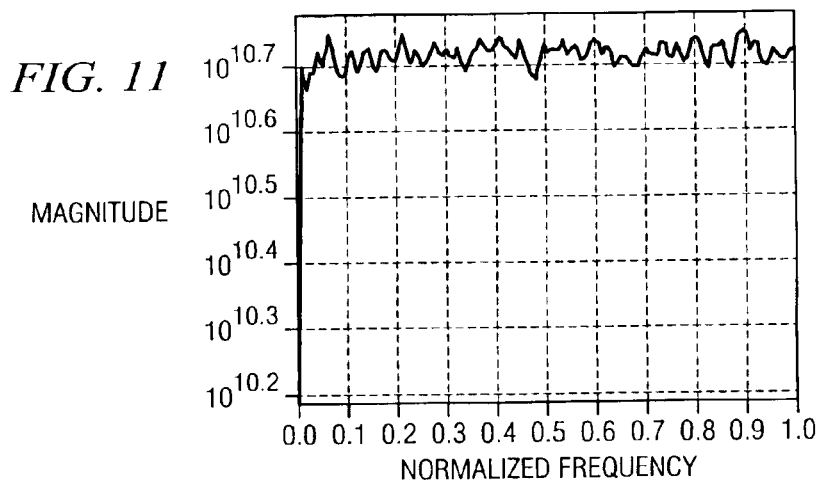

Returning to noise generator 10 of FIG. 1, attention is now directed to the results achieved in output noise signal $N_2$ by applying the preferred aspects discussed above. Particularly, by implementing a triangularly-distributed noise source with a low autocorrelation for noise source block 20, and by implementing in allpass filter(s) block 40 a case of the above-described $15^{th}$ order filter with a duplicate $15^{th}$ order filter, FIGS. 8 through 11 illustrate various attributes of the resulting output noise signal $N_2$. With reference to FIG. 8, it illustrates samples of the output signal $N_2$, where like FIG. 2 which depicts samples of $N_1$, the horizontal axis in FIG. 8 indicates sample time and the vertical axis indicates a digital value corresponding to the sample amplitude. By comparing FIG. 8 to FIG. 2, however, one skilled in the art will appreciate that the output signal $N_2$ of FIG. 8 does indeed have a very different character than the input signal $N_1$ of FIG. 2. Most notably, perhaps, is that in FIG. 2 the magnitude of the input noise signal $N_1$ is only one of three different values, whereas in FIG. 8 the resulting magnitudes vary much more than that that of three different levels. Such a result is desired, as it tends toward a Gaussian distribution. Indeed, turning now to FIG. 9, it illustrates a histogram of the output signal $N_2$ of FIG. 8, wherein the horizontal axis indicates the sample value, and the vertical axis indicates the number of total times a sample value has been counted. One skilled in the art will readily appreciate that the FIG. 9 histogram provides a Gaussian shape. Further, the FIG. 9 plot further emphasizes the notion suggested by FIG. 8 that the output noise, $N_2$, includes far more than the three output levels exhibited by the input signal, $N_1$. FIG. 10 illustrates a plot of the autocorrelation of the output noise signal, $N_2$, where the vertical axis indicates the correlation measure and the horizontal axis indicates the overlay of sampling space of $N_2$ in different time positions relative to it in a fixed time position. From FIG. 10, as was the case with the input signal $N_1$ as shown in FIG. 4, the auto-correlation of the output signal, $N_2$, is uncorrelated with respect to time-shifted versions of itself. Such an attribute is highly desirable if not required for $N_2$ to be a useful test signal. Lastly, FIG. 11 illustrates a spectral density plot of the output noise signal, $N_2$, where the vertical axis indicates magnitude and the horizontal axis indicates a normalized frequency. In FIG. 11, as was the case for the input signal $N_1$ as shown in FIG. 5, one skilled in the art will appreciate that the spectral density of $N_2$ is relatively flat or white. This attribute is also highly desirable if not required for $N_2$ to be a useful test signal.

Figure 12:
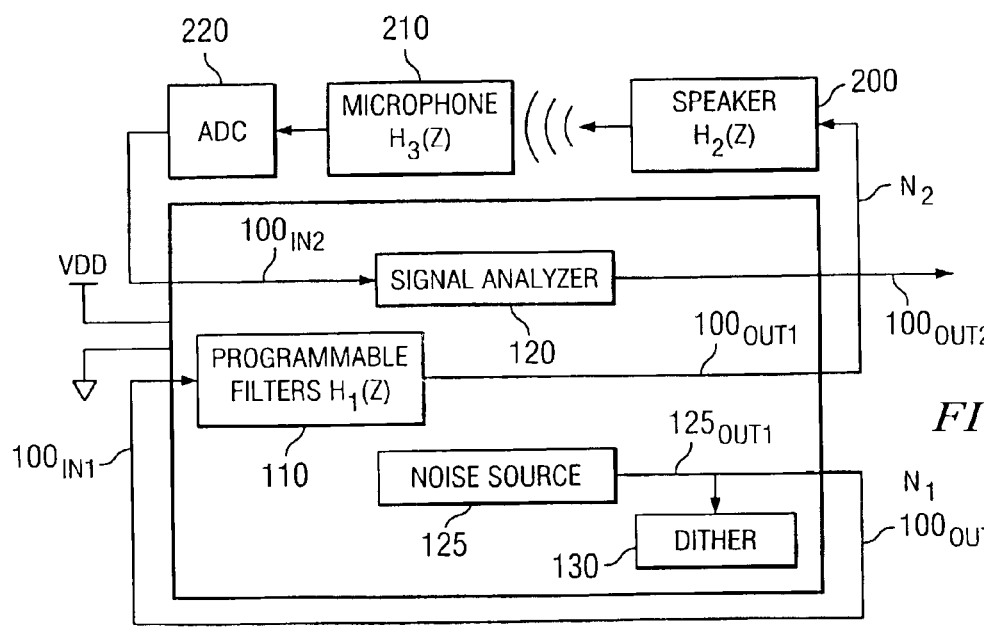

FIG. 12 illustrates an example of an implementation of various of the preceding aspects, as shown in connection with an integrated circuit 100, where integrated circuit 100 includes various functional blocks that are also included in the above-introduced TAS3103, although the TAS3103 includes various other functional blocks that are neither shown nor described so as to simplify the present explanation. Integrated circuit 100 receives power from a source designated generally as $V_{DD}$ and of course is relative to some lower reference voltage shown as ground in FIG. 12. Looking now to the blocks and connections in FIG. 12, a first input $100_{IN1}$ is connected as an input to a programmable filters block 110, where those filters combine to provide an overall transfer function, $H_1(z)$, to the input signal received at input $100_{IN1}$. The output $110_{OUT1}$ of block 110 provides a first output of integrated circuit 100, where such an output may be presented by way of example through an integrated circuit package pin. Also, for reasons described below, first output $110_{OUT1}$ in operation provides the above-described Gaussian-distributed noise output signal, $N_2$. Output $100_{OUT1}$ is connected as an input to a speaker 200, having a transfer function $H_2(z)$. Speaker 200 may be of various types of known speakers, and as detailed below the configuration of FIG. 12 is such that in desired instances the transfer function $H_2(z)$, if not known, may be evaluated. In any event, in response to its input, speaker 200 produces an audio output in the form of sound vibrations, and those are acoustically coupled to a microphone 210, having a transfer function $H_3(z)$. Transfer function $H_3(z)$, if not known, also may be evaluated in some instances as described below. Microphone 210 operates as known in the art, to produce an electrical analog signal in response to the input sound vibrations, and that analog signal is passed through an analog-to-digital converter ("ADC") 220 to a second input, $100_{IN2}$, of integrated circuit 100. Input $100_{IN2}$ is connected to the input of a signal analyzer block 120, which includes sufficient circuitry, including a spectrum analyzer, for analyzing the input signal from input $110_{IN2}$ and which also provides an output signal along an output $100_{OUT2}$. Lastly, integrated circuit 100 includes a noise source 125, which has its output connected to an input of a dither circuit 130 and also to a third output, $100_{OUT3}$, of integrated circuit 100. For reasons described below, nose source block 120 in operation provides the above-described triangularly-distributed noise signal, $N_1$. This signal, as presented at output $100_{OUT3}$, is fed back and connected to input $100_{IN1}$, thereby connecting it to programmable filters block 110.

The operation of integrated circuit 100 and the items external from it are now described. With the application of power via $V_{DD}$, noise source 125 provides an uncorrelated triangularly-distributed noise signal, $N_1$. Note with respect to previous commercial applications of integrated circuit 100 that this noise signal was of use in connection with dither block 130. Briefly with respect to that operation and as known in the art, dither is a function that adds an element of randomization to quantization noise so as to make the quantization noise less prominent, particularly in the case of applications such as that often involving the TAS3103, where a human-audible signal is desired. In any event, since dither block 130 already provides a source of the uncorrelated triangularly-distributed noise signal, $N_1$, then the present inventor has recognized that this source may be combined with the various aspects introduced earlier so as to achieve one implementation of the preferred embodiment.

Further in this regard, recall that $N_1$ is fed back and thereby connected to programmable filters block 110. Thus, those filters may be programmed so that $H_1(z)$ is the same as the transfer function $H(z)$ described earlier in connection with Equation 1. In such an instance, then programmable filters block 110 produces the Gaussian-distributed noise output signal, $N_2$. Next, that signal $N_2$ is connected to speaker 200, which produces a corresponding resultant audible output signal. The audible output signal is received by microphone 210, which produces an analog signal that is converted to digital form by ADC 220 and connected via input $200_{IN2}$ to signal analyzer 120. Given the preceding, note that the spectrum analyzer inside of signal analyzer 120 may be used to measure the response of either speaker 200 or of microphone 210. Specifically, if the response of one of those two devices is known, and given that noise $N_2$ has a Gaussian PDF, then the response of the other of the two devices may be ascertained. Thus, given $H_2(z)$, then $H_3(z)$ may be ascertained in this manner or, alternatively, given $H_3(z)$, then $H_2(z)$ may be ascertained in this manner.

From the above, it may be appreciated that the above embodiments implement circuitry that provides a noise signal having a Guassian PDF with numerous advantages over the prior art. For example, the substituting algorithm approach of the prior art, and the complexity to implement it, may be completely avoided with the approach of the preferred embodiments. As another example, the preferred embodiments have been shown as capable of being implemented by connecting, configuring, and programming an existing commercial device, thereby simplifying at least one such implementation. As yet another example, while the preceding has demonstrated certain instances of the preferred embodiments, the present inventive scope also includes various substitutions, modifications or alterations made to the descriptions set forth above. For example, the preferred embodiments are applicable to transforming other uncorrelated noise sources to Gaussian rather than using the triangularly distributed noise source detailed above. As another example, while the preferred embodiments are shown above in connection with a single uncorrelated noise source, they may be implemented using multiple uncorrelated noise sources—for example, using two such sources, one alternative embodiment may be achieved by filtering both noise sources independently and then summing them together, or another alternative embodiment may be achieved by first summing the two noise sources together and then filtering the sum. As yet another example of a modification to the above description, a different number of filters may be used, and also with respect to each filter they may have a number of zeroes between coefficients differing than the four zeroes shown in Equation 1. Lastly, note that while the preceding has provided a noise source with zero-mean noise, or noise with no DC offset or bias, the preceding techniques could still be applied to an input signal with non-zero mean to produce non-zero mean noise, or the same technique with the addition of a high-pass filter could be used to create zero-mean noise from a non-zero mean noise source. Thus, these many examples further demonstrate the inventive scope as well as the benefits thereof, as will be further appreciated by one skilled in the art and as are further defined by the following claims.

What is claimed is:

1. A signal generator, comprising:
   circuitry for producing at least a first input noise signal; and
   an allpass filter circuit coupled to receive and filter the first input noise signal and for outputting in response a white noise signal having a Gaussian probability distribution function,
   wherein the circuitry for producing is for producing the first input noise signal and a second input noise signal;
   wherein the allpass filter circuit is coupled to receive the first input noise signal as a portion of a sum of the first input noise signal and the second input noise signal; and
   wherein the white noise signal having a Gaussian probability distribution function is responsive to the sum.

2. The signal generator of claim 1 wherein the first input noise signal has a relatively flat magnitude across its power spectral density.

3. The signal generator of claim 2 wherein the first input noise signal comprises a triangularly-distributed noise source.

4. The signal generator of claim 1 wherein the circuitry for producing at least a first input noise signal and the allpass filter circuit are formed on a single integrated circuit.

5. A signal generator, comprising:
   circuitry for producing at least a first input noise signal; and
   an allpass filter circuit coupled to receive and filter the first input noise signal and for outputting in response a white noise signal having a Gaussian probability distribution function,
   wherein the circuitry for producing is for producing the first input noise signal and a second input noise signal;
   wherein the allpass filter circuit is coupled to receive the first input noise signal and the second input noise signal and is for filtering each of the first input noise signal and the second input noise signal; and
   wherein the white noise signal having a Gaussian probability distribution function is responsive to a sum of the filtered first input noise signal and the filtered second input noise signal.

6. A signal generator, comprising:
   circuitry for producing at least a first input noise signal; and
   an allpass filter circuit coupled to receive and filter the first input noise signal and for outputting in response a white noise signal having a Gaussian probability distribution function,
   wherein the allpass filter circuit comprises a filter having an order greater than two.

7. A signal generator, comprising:
   circuitry for producing at least a first input noise signal; and
   an allpass filter circuit coupled to receive and filter the first input noise signal and for outputting in response a white noise signal having a Gaussian probability distribution function,
   wherein the allpass filter circuit comprises a $15^{th}$ order filter.

8. The signal generator of claim 7 wherein the allpass filter circuit comprises a plurality of zeroes between filter coefficients.

9. The signal generator of claim 7 wherein the allpass filter circuit is formed by cascading a plurality of filters.

10. A signal generator, comprising:
    circuitry for producing at least a first input noise signal; and
    an allpass filter circuit coupled to receive and filter the first input noise signal and for outputting in response a white noise signal having a Gaussian probability distribution function, wherein the allpass filter circuit comprises a 30$^{th}$ order filter.

11. The signal generator of claim 10 wherein the allpass filter circuit comprises a plurality of zeroes between filter coefficients.

12. The signal generator of claim 10 wherein the allpass filter circuit is formed by cascading a plurality of filters.

13. A signal generator, comprising:

circuitry for producing at least first input noise signal; and an allpass filter circuit coupled to receive and filter the first input noise signal and for outputting in response a white noise signal having a Gaussian probability distribution function, wherein the allpass filter circuit is formed by cascading a plurality of filters.

14. A signal generator, comprising:

circuitry for producing at least a first input noise signal; and an allpass filter circuit coupled to receive and filter the first input noise signal and for outputting in response a white noise signal having a Gaussian probability distribution function, wherein the allpass filter circuit comprises a transfer function equal to $$H(z) = \frac{0.5 - 0.5z^{-5} - 0.5z^{-10} + z^{-15}}{1 - 0.5z^{-5} - 0.5z^{-10} + 0.5z^{-15}}.$$

15. A signal generator, comprising:

circuitry for producing at least a first input noise signal; and an allpass filter coupled to receive and filter the first input noise signal and for outputting in response a white noise signal having a Gaussian probability distribution function, wheren the circuitry for producing at least a first input noise signal is further for providing a randomizing signal to a dither circuit.

16. A signal generator, comprising:

circuitry for producing at least a first input noise signal; and an allpass filter circuit coupled to receive and filter the first input noise signal and for outputting in response a white noise signal having a Gaussian probability distribution function, wherein the allpass filter circuit comprises a filter having an order greater than two; and wherein the allpass filter circuit comprises a plurality of zeroes between filter coefficients.

17. A signal generator, comprising:

circuitry for producing at least a first input noise signal; and an allpass filter circuit coupled to receive and filter the first input noise signal and for outputting in response a white noise signal having a Gaussian probability distribution function, wherein the circuitry for producing is for producing the first input noise signal and a second input noise signal;

wherein the allpass filter circuit is coupled to receive the first input noise signal as a portion of a sum of the first input noise signal and the second input noise signal; and wherein the white noise signal having a Gaussian probability distribution function is responsive to the sum; and wherein the allpass filter circuit comprises a filter having an order greater than two.

18. The signal generator of claim 17 wherein the allpass filter circuit comprises a plurality of zeroes between filter coefficients.

19. A signal generator, comprising:

circuitry for producing at least a first input noise signal; and an allpass filter circuit coupled to receive and filter the first input noise signal and for outputting in response a white noise signal having a Gaussian probability distribibution function, wherein the circuitry for producing is for producing the first input noise signal and a second input noise signal;

wherein the allpass filter circuit is coupled to receive the first input noise signal as a portion of a sum of the first input noise signal and the second input noise signal;

wherein the white noise signal having a Gaussian probability distribution function is responsive to the sum; and wherein each of the first input noise signal and the second input noise signal comprises a triangularly-distributed noise source.

20. A signal generator, comprising:

circuitry for producing at least a first input noise signal; and an allpass filter circuit coupled to receive and filter the first input noise signal and for outputting in response a white noise signal having a Gaussian probability distribution function, wherein the circuitry for producing is for producing the first input noise signal and a second input noise signal;

wherein the allpass filter circuit is coupled to receive the first input noise signal and the second input noise signal and is for filtering each of the first input noise signal and the second input noise signal;

wherein the white noise signal having a Gaussian probability distribution function is responsive to a sum of the filtered first input noise signal and the filtered second input noise signal; and wherein the allpass filter circuit comprises a filter having an order greater than two.

21. The signal generator of claim 20 wherein the allpass filter circuit comprises a plurality of zeroes between filter coefficients.

22. A signal generator, comprising:

circuitry for producing at least a first input noise signal; and an allpass filter coupled to recieve an filter the first input noise signal and for outputting in response a white noise signal having a Gaussian probability distribution function, wherein the circuitry for producing is for producing the first input noise signal and a second input noise signal;

wherein the allpass filter circuit is coupled to receive the first input noise signal and the second input noise signal and is for filtering each of the first input noise signal and the second input noise signal;

wherein the white noise signal having a Gaussian probability distribution function is responsive to a sum of the filtered first input noise signal and the filtered second input noise signal; and wherein each of the first input, noise signal and the second input noise signal comprises a triangularly-distributed noise source.

23. A method of generating a white noise signal having a having a Gaussian probability distribution function, the method comprising:

operating circuitry to produce at least a first input noise signal; and filter the first noise signal with an allpass filter circuitry and outputting in response the white noise signal, wherein the first input noise signal comprises a triangularly-distributed noise source.

24. The method of claim 23 wherein the first input noise signal has a relatively flat magnitude accoss its power spectral density.

25. A method of generating a white noise signal having a having a Gaussian probability distribution function, the method comprising:

operatinq circuitry to produce at least a first input noise signal; and filter the first input noise signal with an allpass filter circuitry and outputting in response the white noise signal, wherein the allpass filter circuitry comprises a filter having an order greater than two.

26. The method of claim 25 wherein the allpass filter circuit comprises a plurality of zeroes between filter coefficients.

27. A method of generating a white noise signal having a having a Gaussian probability distribution function the method comprising:

operating circuitry to produce at least a first input noise signal; and filter the first input noise signal with an allpass filter circuitry and outputting in response the white noise signal, wherein the allpass filter circuit comprises a $15^{th}$ order filter.

28. A method of generating a white noise signal having a having a Gaussian probability distribution function, the method comprising:

operating circuitry to produce at least a first input noise signal; and filter the first input noise signal with an allpass filter circuitry and outputting in response the white noise signal, wherein the allpass filter circuit comprises a $30^{th}$ order filter.

29. A method of generating a white noise signal having a having a Gaussian probability distribution function, the method comprising:

operating circuitry to produce at least a first input noise signal; and filter the first input noise signal with an allpass filter circuitry and outputting in response the white noise signal, wherein the allpass filter circuit comprises a transfer function equal to $$H(z) = \frac{0.5 - 0.5z^{-5} - 0.5z^{-10} + z^{-15}}{1 - 0.5z^{-5} - 0.5z^{-10} + 0.5z^{-15}}.$$

* * * * *